United States Patent [19]

Sugimoto et al.

[11] Patent Number: 4,651,187
[45] Date of Patent: Mar. 17, 1987

[54] AVALANCHE PHOTODIODE

[75] Inventors: Yoshimasa Sugimoto; Toshitaka Torikai; Kenko Tagushi, all of Tokyo, Japan

[73] Assignee: NEC Corporation, Tokyo, Japan

[21] Appl. No.: 713,669

[22] Filed: Mar. 19, 1985

[30] Foreign Application Priority Data

Mar. 22, 1984 [JP] Japan .................................. 59-54907
Mar. 22, 1984 [JP] Japan .................................. 59-54908
Oct. 14, 1984 [JP] Japan .................................. 59-223226
Oct. 14, 1984 [JP] Japan .................................. 59-223230

[51] Int. Cl.[4] ...................... H01L 27/14; H01L 31/00
[52] U.S. Cl. ........................................ 357/30; 357/13; 357/16; 357/20; 357/52
[58] Field of Search ....................... 357/52, 13, 30, 16, 357/20

[56] References Cited

PUBLICATIONS

Hino et al., "Ge APD Characteristics for Optical Communications", NEC Research & Development, No. 67, pp. 67-72, Oct. 1982.
Sugimoto et al., "Response Characteristics of VPE--Grown InP/InGaAsP/InGaAs-APD", Proceeding of the 1st Spring Meeting of Japan Society of Applied Physics and Related Societies, Issued in Mar. 29, 1984.
InGaAs Avalanche Photodiodes for 1 μm Wavelength Region; Electronics Letters, Jul. 7, 1983, vol. 19, No. 14-T. Shirai, T. Mikawa, T. Kaneda-pp. 534-536.
InGaAsP Heterostructure Avalanche Photodiodes with High Avalanche Gain; Appl. Phys. Lett. 35(3) Aug. 1, 1979-K. Nishida, K. Taguchi, Y. Matsumoto-pp. 251 and 252.

Primary Examiner—William L. Sikes
Assistant Examiner—Georgia Y. Epps
Attorney, Agent, or Firm—Sughrue, Mion, Zinn, Macpeak and Seas

[57] ABSTRACT

An avalanche photodiode having a semiconducting light absorbing layer and an overlying avalanche gain layer of wide band-gap. The usual heavily doped region is formed in the avalanche gain region to form an abrupt p-n junction. Two semiconducting guard rings are formed around the heavily doped region. The doping of both rings provide graded p-n junctions with the avalanche gain layer. The inner guard ring extends more deeply into the avalanche gain layer than either the outer ring or the heavily doped region.

4 Claims, 14 Drawing Figures

AVALANCHE PHOTODIODE

BACKGROUND OF THE INVENTION

The present invention relates to a semiconductor photodetector, and more particularly to a planar type heterojunction avalanche photodetector having a guard ring effect and its manufacturing method.

Attempts are being made to develop avalanche photodiodes (APDs) using $In_{0.53}Ga_{0.47}As$ as light detectors for use in optical communications in the 1.0 to 1.6 micron wavelength region, where the transmission loss of optical fibers is relatively small. Since $In_{0.53}Ga_{0.47}As$ is lattice-matched to InP, and permits the formation of a heterojunction, it is possible to realize a photodetector which uses InGaAs and InP as a light absorbing layer and an avalanche gain layer, respectively. Such a photodetector is designed to achieve avalanche gain by conveying either the electron or the hole carrier which is generated in the InGaAs layer by optical excitation to the InP avalanche gain layer, resulting in reduction in dark current and excess noise and accordingly in a higher receiver sensitivity. K. Nishida et al. proposed this idea in Appl. Phys. Lett., Vol. 35, No. 3, pp. 251–253 (1979). FIG. 1 illustrates the structure proposed by Nishida et al., wherein a p+-n junction is formed by providing a p-type conductivity region 5 after successively growing on a substrate 1 an n-InP buffer layer 2, an n⁻-$In_{0.53}Ga_{0.47}As$ layer 3, an n-InP layer 4 and an n⁻-InP layer 4'. The p+-n junction is sometimes called a one-sided abrupt or a one-sided step junction wherein acceptor impurity concentration is much greater than donor impurity concentration particularly away from the abrupt or step p-n junctions. In the abrupt or step junction, the impurity concentration in a semiconductor changes abruptly from acceptor impurities to donor impurities. Therefore, when a reverse bias voltage is applied to the p-n junction, the conductivity region with lower carrier concentration is selectively depleted. Further in FIG. 1, reference numerals 6, 7 and 8 respectively represent a surface protecting film which also provides anti-reflection, a p-electrode and an n-electrode. Under the application of a reverse bias voltage which is enough for the depleted region to reach the InGaAs layer 3, the InGaAs layer 3 having a smaller bandgap absorbs light and only the positive hole carrier generated therein is conveyed to the p+-n junction formed in the InP layer 4 having a larger bandgap to achieve avalanche gain. A voltage breakdown occurs in the InP layer 4 with the generation of a tunnel current from the InGaAs layer 3 suppressed, achieving a low dark current photodetector.

In the structure of FIG. 1, however, the peripheral part 5a of the selectively formed p+-n junction has its center of curvature within the p-type conductivity region 5 (this being referred to as having a "positive curvature") and, when a reverse bias voltage is applied to the p-n junction, high electric field concentrates in this "positive curvature" part 5a, resulting in a voltage breakdown thereat at a voltage lower than in the planar part 5b of the p-n junction (a so-called edge breakdown). This edge breakdown is particularly conspicuous when the carrier concentration of the InGaAs layer 3 is much lower than that of the InP layer 4. This fact means that no sufficient carrier avalanche gain is achieved in the planar part 5b corresponding to the light receiving region.

T. Shirai et al. proposed the structure illustrated in FIG. 2 to suppress this edge breakdown (Electron. Lett., Vol. 19, No. 14, pp. 534–535, 1983). In this structure, a p-type conductivity region 5' (a so-called guard ring), wherein a graded p-n junction whose breakdown voltage is higher than in a p+-n junction, or another p-n junction which can be approximated to the graded type junction is provided in such a position in the peripheral part of the p+-n junction that the depth from the surface of the graded or similar p-n junction is substantially equal to that of the p+-n junction. The graded p-n junction here means a p-n junction wherein concentrations of donor and acceptor change substantially linearly in the vicinity of the p-n junction. Accordingly, a junction whose depletion region, when a reverse bias voltage is applied to the graded p-n junction, is extended approximately equally toward the p-type and n-type conductivity regions. Even with the structure of FIG. 2, however, it is difficult to realize high avalanche gain while preventing the edge breakdown. The reason will be explained below. When a reverse bias voltage is applied to the p-n junction, while the depletion region of a p+-n junction grows mainly toward the n-type conductivity region, that in a graded p-n junction grows on both sides toward both the p-type and n-type conductivity regions. Therefore, the peripheral depletion region ends 5a of a p+-n junction have positive curvatures, as indicated by the depletion distribution 5d marked with oblique lines in FIG. 3 and accordingly, like in the aforementioned case of FIG. 1, an edge breakdown is apt to ultimately occur in this positive curvature part 5a.

Then a structure wherein the positive curvature parts 5a in FIG. 1 are completely enclosed, may be effective. Such a structure is well known to be effective for an APD composed of a single semiconductor, such as an Si-APD or a Ge-APD (see, for example, I. Hino et al., "Ge APD Characteristics for Optical Communications", NEC RESEARCH & DEVELOPMENT, No. 67, October 1982, pp. 67–72.). The inventors tried to apply such a structure to a heterojunction APD using compound semiconductors, and however found it difficult to achieve uniform avalanche gain with a high reproducibility, with its edge breakdown sufficiently restrained. FIG. 4 illustrates the heterojunction APD that the inventors tried. In this structure, The junction position of a guard ring 5' comes closer to the heterointerface between an InGaAs layer 3 and an InP layer 4 than to a p+-n junction 5b, so that the electric field strength in the InGaAs layer is greater in the region beneath the guard ring part than in the region beneath the p+-n junction part. Therefore, there emerges in the guard ring part an effect of the voltage breakdown in the InGaAs layer. This effect is the strongest in the positive curvature parts 5'a of the guard ring, and is due to the fact that voltage breakdown occurs in the positive curvature parts 5'a on the periphery of the guard ring before a breakdown takes place in the p+-n junction part.

SUMMARY OF THE INVENTION

An object of the present invention, therefore, is to obviate the aforementioned disadvantages and to provide a structure for a heterojunction APD capable of achieving sufficient and uniform avalanche gain in a stepwise p-n junction region corresponding to its light receiving region before a voltage breakdown occurs in its guard ring, and a method for the manufacture thereof.

According to the invention, an avalanche photodiode comprises: a light absorbing semiconductor layer; an avalanche gain semiconductor layer having a bandgap greater than that of said light absorbing semiconductor layer; a first p-n junction having a substantially adrupt $p^+$-n junction and selectively provided in said avalanche gain semiconductor layer; a second p-n junction having a substantially graded p-n junction surrounding the periphery of said first p-n junction; and a third p-n junction having a substantially graded p-n junction and surrounding the periphery of said second p-n junction.

A specific feature of the invention is that said second p-n junction is positioned deeper from the upper surface than said first p-n junction and said third p-n junction is positioned closer to the upper surface than said second p-n junction.

In accordance with the invention, there is used a composite guard ring structure wherein an inner first guard ring positioned close to the $p^+$-n junction is so arranged as to be deeper than the $p^+$-n junction. Further the positive curvature of the periphery of the first guard ring is then reduced and, accordingly, a second guard ring, positioned shallower than the p-n junction of the first guard ring, is provided around the periphery of the first guard ring so as to ease the effect of voltage breakdown in the InGaAs layer thereof. This structure completely encloses the "positive curvature" in the depletion layer distribution in the peripheral part of the $p^+$-n junction and eases the positive curvature of the peripheral part of the guard rings, thereby contributing to the improvement of the breakdown voltage of the guard rings themselves.

DETAILED DESCRIPTION OF THE PREFERRED EMBODIMENTS

Although the following detailed description refers to a preferred embodiment using an InP/InGaAs-based hetero-junction APD, it may be readily understood that the principle of the invention can be applied exactly as effectively to other hetero-junctions, including AlGaSb/GaSb, AlGaAs/GaSb junctions and so on.

Figure 5:
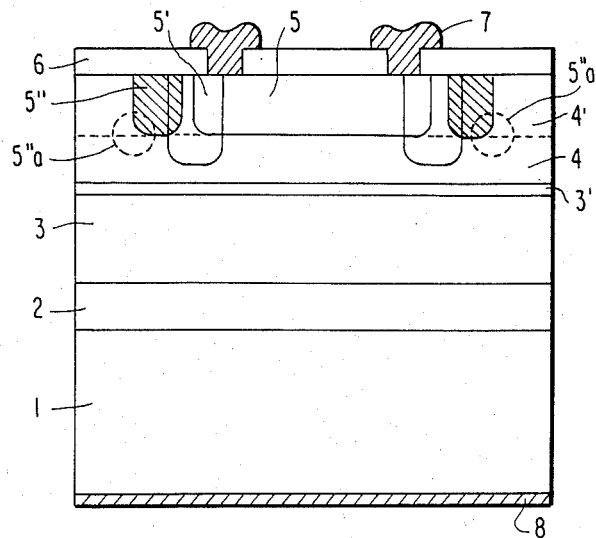
FIG. 5 is a sectional view of an APD which is one preferred embodiment of the present invention.

Referring to FIG. 5, an avalanche photodiode (APD) comprises an n-InP buffer layer 2 (about 1 micron thick), an $n^-$-$In_{0.53}Ga_{0.47}As$ layer 3 (about 3.5 microns thick) of $3\sim5\times10^{15}$ cm$^{-3}$ in carrier concentration, lattice-matched to InP, an InGaAsP layer 3' (about 0.1 micron thick) having a band-gap corresponding to a wavelength of 1.3 microns, an n-InP layer 4 (1.5 to 2.5 microns thick) of $1\sim2\times10^{16}$ cm$^{-3}$ in carrier concentration, and an $n^-$-InP layer 4' (1.5 to 2.0 microns thick) of $1\sim5\times10^{15}$ cm$^{-3}$ in carrier concentration, successively grown over a sulfur-doped (S-doped) $n^+$-InP substrate 1. The n-InP buffer layer 2 is intended to prevent any defects or dislocations in the InP substrate 1 from reaching the layers 3 to 4' during the layer growth process; the $n^-$-InGaAs layer 3, to absorb light of 1 to 1.7 microns in wavelength and generating hole and electron carriers; the n-InGaAsP layer 3', to prevent transit delay of the hole carrier owing to discontinuity in the valence band maximum between the InP layer 4 and the InGaAs layer 3; the n-InP layer 4 is an avalanche gain layer; and the $n^-$-InP layer 4' is mainly intended to facilitate the expansion of a depletion layer in the peripheral part of the p-n junction, especially in its region close to the upper surface. Further the APD has a $p^+$ type conductivity region 5 (about 80 microns in diameter) selectively formed in the central part of the n-InP layer 4' in a round or an oval shape as viewed from above; a first guard ring 5' (about 100 microns in outer diameter) formed in the peripheral part of the $p^+$ region in a ring form as viewed from above; and a second guard ring 5" (about 110 microns in outer diameter) formed in the peripheral part of the first guard ring 5 in a ring shape as viewed from the above. A p-electrode 7 is provided in a ring form over the $p^+$ type conductivity region 5 through a window selectively etched into a surface passivation film 6, and an n-electrode is formed all over the lower surface of the substrate 1.

The layers 2, 3, 3', 4 and 4' were grown over the InP substrate 1 etched with a mixture of $H_2SO_4$, $H_2O$ and $H_2O_2$ in a ratio of 3:1:1, by hydride transport vapor phase epitaxy at a substrate temperature of 700° C. in a reactor combining an InP growth chamber, an InGaAsP growth chamber and an InGaAs growth chamber. After the epitaxial laminated structure was formed, beryllium ion implantation was applied to realize the guard ring structure illustrated in FIG. 5. This method was used in view of the fact that a p-n junction resembling a graded type could be most readily formed with beryllium. An $SiO_2$ film, about 1 micron thick, was deposited at 370° C. over the layer 4' by the pyrolytic chemical vapor deposition method (hereinafter abbreviated to the pyrolytic CVD method); the $SiO_2$ film was selectively removed in a ring pattern by a buffered fluoric acid etching solution with a photo-resist mask having a window of a ring pattern, and afterwards beryllium ions were implanted to provide the first guard ring 5' in an accelerating voltage range of 100 to 140 kV and in a dosage of 3 to $5\times10^{15}$ cm$^{-2}$. In this process, beryllium ions were implanted only into the InP crystals exposed by the selective etching of the windows through the $SiO_2$ film.

Then, the diameter of the ring-shaped window bored into the $SiO_2$ film was enlarged by common light-exposure and etching techniques, and beryllium ions were again implanted to form the second guard ring 5" in an accelerating voltage range of 70 to 100 kV and in a dosage of 1 to $3\times10^{13}$ cm$^{-2}$. Generally in ion implantation, the lower the ion accelerating voltage (i.e. the shorter the projection range of ions) and the smaller the dose of implanted ions, the lower the concentration of implanted ions at a given depth from the surface. This trend would remain unchanged even if, after ion implantation, thermal treatment for activation is conducted to form a p-type conductivity region. Therefore, in implanting ions for the formation of the second guard ring 5", the implantation accelerating voltage and the dosage were selected lower than those for the formation of the first guard ring so that the junction position of the second guard ring could be shallower from the surface than that of the first. After implanting ions for the formation of the first and second guard rings, the SiO₂ film was removed by etching with fluoric acid solution; then a phosphorous-silicate glass (PSG) film was deposited to a thickness of about 100 nm at 370° C. by the pyrolytic CVD method, and thermal treatment at 700° C. was performed for 20 minutes for the activation and drive-in diffusion of beryllium ions to form the first guard ring 5' and the second guard ring 5" to constitute graded p-n junctions. After that, the p-type conductivity region 5 was so formed by the thermal diffusion of cadmium that the stepwise p-n junction would be positioned about 0.5 micron shallower from the surface than the junction position of the first guard ring. The diffusion was done for 20 to 30 minutes at 570° C. through the PSG film, with a round window selectively bored by the use of an exposure mask within the guard rings. Then, after removing the PSG film with fluoric acid solution, the SiN surface passivation film 6 was deposited to a thickness of 150 to 200 nm by the plasma enhanced CVD method at 300° C., and after that, a window was selectively bored on the p-type conductivity region 5 by the light exposure technique using a photoresist mask on which a ring-shaped pattern was drawn, followed by the successive deposition of titanium, platinum and gold to thicknesses of 100 nm, 100 nm and 300 nm, respectively, by the electron-bombardment vaporization method to form the p-electrode 7. Further, the n-electrode was formed on the lower surface of the substrate 1 by the resistive heating vaporization method using AuGe/Ni alloy.

In order to check the breakdown voltage of the guard rings, along with the foregoing process, there were also formed, by the use of wafers having the same epitaxial stratified structure, a graded p-n junction having only the first guard ring and another graded p-n junction of a structure in which the periphery of the first guard ring was surrounded by the second guard ring. The breakdown voltage of the p-n junction having the first guard ring alone was 100 to 120 V, while that of the other junction having two guard rings was 120 to 150 V, realizing the advantage of the present invention. Further the voltage at which the end of the depletion layer would reach the InGaAs layer when a reverse bias voltage was applied, namely the punch-through voltage, was about 30 V in the guard ring section, and about 40 V in the p⁺-n junction 5. Since the depletion layer reaches the InGaAs layer at a lower voltage in the guard ring section than in the p⁺-n junction, it is evident that the invention serves to obviate the "positive curvature" in the peripheral part of the p⁺-n junction, which was observed in the conventional depletion layer distribution shown in FIG. 3.

Figure 6:
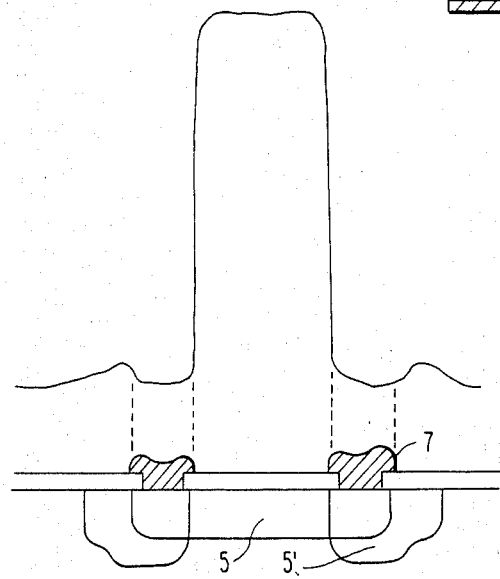
FIG. 6 shows a gain sensitivity distribution profile of the APD according to the invention.

The breakdown voltage of the completed APD ranged from 100 to 110 V, lower than the 120 to 150 V breakdown voltage of the guard ring section. Accordingly, the avalanche multiplication was sufficiently achieved in the p⁺-n junction corresponding to the light receiving region surrounded by the ring-shaped electrode 7. This effect is illustrated in FIG. 6, wherein 11 represents a typical gain sensitivity distribution, well indicating a greater avalanche gain in the p⁺-n junction corresponding to the light receiving region than in the guard ring section. The maximum avalanche gain factor was from 40 to 60. In contrast to the maximum gain factor of less than 10 that could be previously achieved under the limitation of edge breakdown, the advantage of the present invention is evident.

FIGS. 7a to 7d are intended to describe a second preferred embodiment of the present invention, one of whose specific features is the method of forming its guard rings. What was said about the first embodiment holds exactly true with the structures of the semiconductor substrate and the epitaxial layers formed thereover for this APD and their manufacturing method. In FIGS. 7a to 7d, is illustrated only the right hand side of the bilaterally symmetrical section of only the portions of an n-InP layer 4 and an n⁻-InP layer 4', which play a part in the formation of guard rings. The left contour line of each drawing corresponds to the central axis of the APD that is produced. Therefore, in the process, the unillustrated left side simultaneously undergoes the same processing.

Figure 7A:
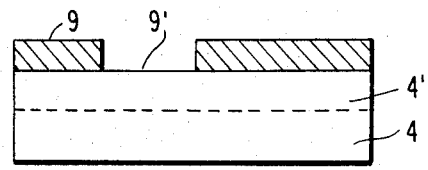
FIGS. 7a to 7d are sectional views for describing a manufacturing method of the APD according to the invention.
Figure 7B:
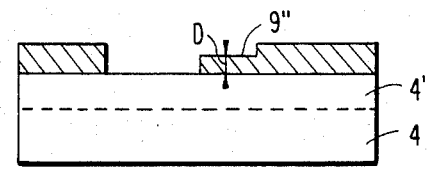
Figure 7C:
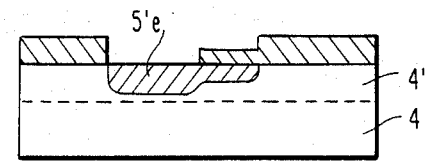

As an ion implantation mask 9, an SiO₂ film was deposited over the n⁻-InP layer 4' to a thickness of about 1 micron by the pyrolytic CVD method at 370° C., and a ring-shaped window region 9' was selectively etched to form a guard ring by the conventional exposure technique using an exposure mask on which a ring pattern was drawn (FIG. 7a). The ring measures 100 microns in inner diameter and 10 microns in width. Buffered fluoric acid solution was used for the etching removal of the SiO₂ film. Then, the SiO₂ film on the the periphery of the ring-shaped window region 9' was thinned to form an approximately 10 micron wide ring 9" of about 100 nm in thickness by the use of buffered fluoric acid etching solution (FIG. 7b). This 100 nm thickness was selected for the purpose of making the ring thinner than the 300 to 500 nm projected range of beryllium ions to be implanted at the next step. Therefore, when beryllium ions were implanted at an accelerating voltage ranging from 100 to 140 kV and in a dosage of 3 to 5×10¹³ cm⁻², the beryllium implanted through the thin film ring 9" was positioned shallower and less concentrated than that implanted into the window region 9' as shown in FIG. 7c.

Figure 7D:
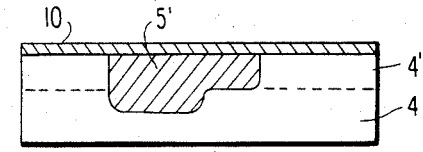

After that, the implantation mask 9 was fully removed with fluoric acid solution, and instead a PSG film for protection against thermal treatment was deposited all over the n⁻-InP layer 4' to a thickness of about 100 nm by the pyrolytic CVD method at 370° C. In this state, thermal treatment was performed at 700° C. for 20 minutes for the purpose of activation and drive-in diffusion of beryllium ions to form a guard ring 5', which would constitute an graded p-n junction (FIG. 7d). The shape of the guard ring thereby formed, as illustrated in FIG. 7d, was exactly identical with the envelope shape of the dual guard rings shown in FIG. 5. The punch-through voltage and breakdown voltage of the guard ring were checked up at this point of time, and found to be 30 to 40 V and 120 to 150 V, respectively. Then a p⁺-n junction, a surface passivation film and p- and n-electrodes were formed by exactly the same manufacturing methods as in the first preferred embodiment to complete an APD.

Figure 1:
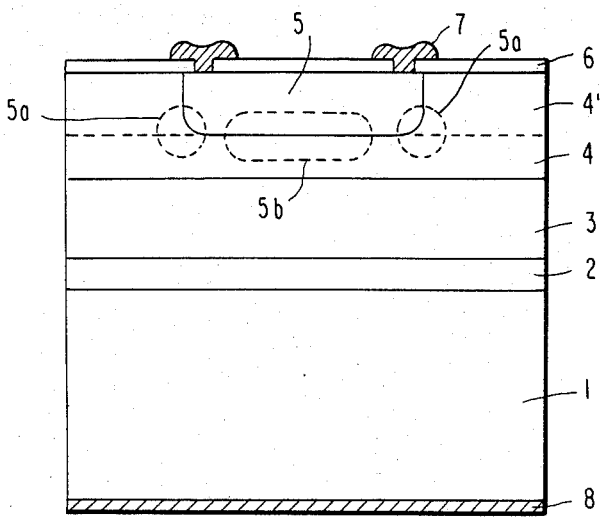
FIGS. 1 and 2 are sectional views of prior art APD structures.
Figure 2:
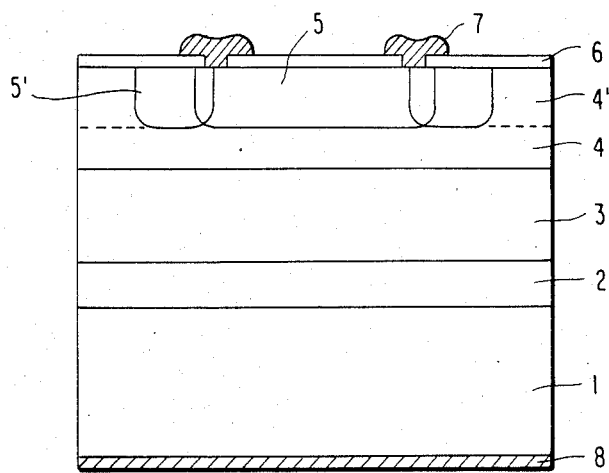
Figure 3:
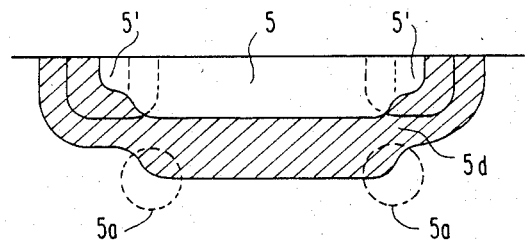
FIG. 3 is a sectional view for describing the edge breakdown of the structure of FIG. 2.
Figure 4:
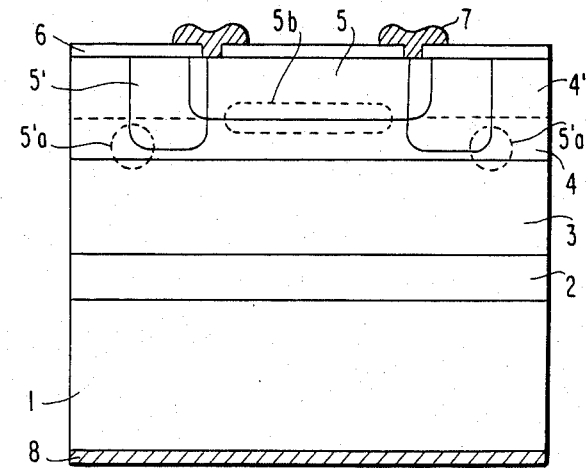
FIG. 4 illustrates a sectional view of an APD which the inventors conceived and tried in the process of inventing the present invention (and which is not prior art to the present invention).

The breakdown voltage of the APD completed was within the range of 100 to 110 V, lower than the 120 to 150 V breakdown voltage of the aforementioned guard ring. The punch-through voltage at the p⁺-n junction ranged from 40 to 50 V, about 10 V larger than the 30 to 40 V of the guard ring section. This means the absence of the "positive curvature" in the periphery of the step p+-n junction, which was present in the conventional depletion layer distribution as shown in FIG. 3. Further, the distribution of avalanche gain sensitivity, like in the first preferred embodiment, is such as illustrated in FIG. 6, with a maximum avalanche gain factor of 40 to 60 times.

FIGS. 8a to 8d illustrate a third preferred embodiment of the photodetector manufacturing method according to the present invention, and in particular are intended for describing guard ring formation. Since the structures of the semiconductor substrate and the epitaxial layers formed thereover for this APD and their manufacturing method are exactly identical with those for the first embodiment, only an n-InP layer 4 and an n⁻-InP layer 4', which play a part in guard ring formation, are illustrated here. In these figures again, only the right hand side of the bilaterally symmetrical section is shown. Therefore, in the ensuing process, the unillustrated left side simultaneously undergoes the same processing as the right side.

Figure 8A:
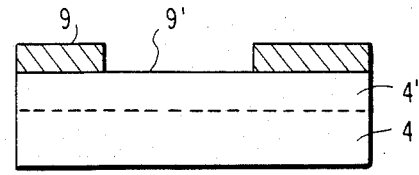
FIGS. 8a to 8d are sectional views for describing another manufacturing method of the APD according to the invention.
Figure 8B:
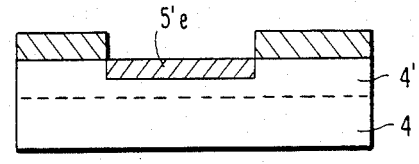
Figure 8C:
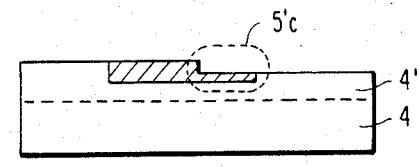
Figure 8D:
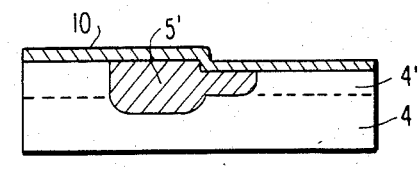

As an ion implantation mask 9, an $SiO_2$ film was deposited over the n⁻-InP layer 4' to a thickness of about 1 micron by the pyrolytic CVD method at 370° C., and a ring-shaped window region 9' was selectively etched to form a guard ring by the conventional exposure technique using an photo-resist mask on which a ring pattern was drawn (FIG. 8a). The ring measures 100 microns in inner diameter and 10 microns in width. Buffered fluoric acid solution was used for the etching removal of the $SiO_2$ film. Next, beryllium ions were implanted via the ion implantation mask 9 at an accelerating voltage of 100 to 140 kV and in a dosage of 3 to $5 \times 10^{13}$ cm⁻² into n⁻-InP crystals exposed in the selectively opened region 9' to achieve a beryllium ion distribution 5'e (FIG. 8b). Then, an approximately 0.5 micron thickness of the InP layer on the periphery of the ring into which beryllium ions had been implanted was removed, in a 5 micron wide ring form, by etching with a mixture of $H_2SO_4$, $H_2O$ and $H_2O_2$ in a ratio of 3:1:1 to form a lower step 5'c (FIG. 8c). Accordingly, the number of beryllium ions present below the lower step 5'c is sufficiently smaller than the initially implanted number of 3 to $5 \times 10^{13}$ cm⁻². When thermal treatment for the activation and drive-in diffusion is performed where there is a difference in implanted ion concentration beryllium is diffused more deeply in the high-concentration region than in the low-concentration region to form a p-type conductivity region 5' as illustrated in FIG. 8d. Thus, after the ion implantation, the implantation mask 9 was fully removed and instead a PSG film for protection against thermal treatment was deposited all over the n⁻-InP layer 4' to a thickness of about 100 nm by the pyrolytic CVD method at 370° C., and then thermal treatment was performed at 700° C. for 20 minutes to form a guard ring 5', which would constitute a graded p-n junction (FIG. 8d). Then a p+-n junction, a surface passivation film and p- and n-electrodes were formed by exactly the same manufacturing methods as in the first preferred embodiment to complete an APD.

The punch-through voltage, breakdown voltage and avalanche gain sensitivity distribution of the APD thereby completed were found substantially the same as those of the first preferred embodiment, and accordingly demonstrated the advantage of the present invention.

What is claimed is:

1. In a planar heterostructure avalanche photodiode, said avalanche photodiode comprising:
   a first semiconductor layer of a first conductivity type for absorbing light;
   a second semiconductor layer of said first conductivity type, overlying said first layer and having a greater bandgap than said first layer, for avalanche-multipling injected carriers from said first semiconductor layer, said second semiconductors layer being different in material from said first semiconductor layer;
   a first semiconductor region of a second conductivity type, having a substantially higher doping concentration than said second layer, and formed in a portion of said second layer to provide a circumferential boundary and a front boundary defining said first semiconductor region, wherein a substantially abrupt first p-n junction is formed between said first region and said second region;
   a second semiconductor region of said second conductivity type formed in a ring shape and surrounding the periphery of said first region to overlap said circumferential boundary of said first region and to extend beyond said front boundary of said second region, wherein a substantially graded second p-n junction is formed between said second region and said second layer; and
   a third semiconductor region of said second conductivity type formed in a ring shape and surrounding the periphery of said second region overlapping the outer circumferential boundary defining said second semiconductor region but not extending beyond the front boundary of said second semiconductor region, wherein a substantially grated third p-n junction is formed between said third region and said second layer.

2. A photodiode as recited in claim 1, wherein said second region is contiguous to said first region and to said third region and said first, second and third p-n junctions form a continuous p-n junction.

3. A photodiode as recited in claim 2, wherein said second p-n junction is located further from an upper surface of said photodiode than either said first p-n junction or said third p-n junction.

4. A photodiode as recited in claim 1, further comprising two electrode means electrically connected to respectively said first layer and said first region.

* * * * *

UNITED STATES PATENT AND TRADEMARK OFFICE
CERTIFICATE OF CORRECTION

PATENT NO. : 4,651,187
DATED : March 17, 1987
INVENTOR(S) : YOSHIMASA SUGIMOTO, TOSHITAKA TORIKAI, AND KENKO TAGUSHI It is certified that error appears in the above-identified patent and that said Letters Patent is hereby corrected as shown below:

On the title page

PRIORITY DATA: "October 14, 1984" should be --October 24, 1984-- in both occurances.

Column 3, lines 62-63, delete "Al-GaSb/GaSb, AlGaAs/GaSb" insert --Al-GaAs/GaAs, AlGaSb/GaSb--.

Column 6, line 19, before "process" insert --ensuing--.

Signed and Sealed this

Twenty-fourth Day of November, 1987

Attest:

DONALD J. QUIGG

*Attesting Officer*      *Commissioner of Patents and Trademarks*